(12) United States Patent
Tian et al.

(10) Patent No.: US 8,925,351 B2
(45) Date of Patent: Jan. 6, 2015

(54) MANUFACTURING METHOD OF TOP PLATE OF PLASMA PROCESSING APPARATUS

(71) Applicant: Tokyo Electron Limited, Tokyo (JP)

(72) Inventors: Caizhong Tian, Amagasaki (JP); Toshihisa Nozawa, Amagasaki (JP); Kiyotaka Ishibashi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/938,507

(22) Filed: Jul. 10, 2013

(65) Prior Publication Data
US 2013/0292047 A1  Nov. 7, 2013

Related U.S. Application Data

(62) Division of application No. 12/157,660, filed as application No. PCT/JP2007/050914 on Jan. 22, 2007, now abandoned.

(30) Foreign Application Priority Data

Jan. 20, 2006 (JP) .................................. 2006-012965
Jan. 22, 2007 (TW) ................................ 96102364 A

(51) Int. Cl.
C03C 27/10 (2006.01)
C03C 27/00 (2006.01)
B32B 37/12 (2006.01)
H01J 37/32 (2006.01)

(52) U.S. Cl.
CPC ........... B32B 37/12 (2013.01); H01J 37/32192 (2013.01); H01J 37/3244 (2013.01); H01J 37/32623 (2013.01); H01J 2237/0206 (2013.01)
USPC ....................... 65/43; 156/345.33; 156/345.34

(58) Field of Classification Search
USPC ................... 118/723 R; 438/710; 156/345.1; 65/33.5, 33.6, 36, 43; 264/642, 666, 264/628, 678
See application file for complete search history.

(56) References Cited

U.S. PATENT DOCUMENTS

| 6,095,084 | A | 8/2000 | Shamouilian et al. |
| 6,095,389 | A | 8/2000 | Fenton et al. |
| 6,490,145 | B1 | 12/2002 | Kholodenko et al. |
| 8,038,834 | B2 * | 10/2011 | Funk et al. ............... 156/345.29 |
| 8,083,891 | B2 * | 12/2011 | Sato ......................... 156/345.47 |

(Continued)

FOREIGN PATENT DOCUMENTS

| JP | 03-191073 A | 8/1991 |
| JP | 05-343334 A | 12/1993 |

(Continued)

Primary Examiner — Jason L Lazorcik
(74) Attorney, Agent, or Firm — Pearne & Gordon LLP

(57) ABSTRACT

A manufacturing method of a top plate hermetically attached to an upper opening of a tubular shaped container body for forming a processing container of a plasma processing apparatus is provided. The manufacturing method includes the steps of; preparing a top plate body comprised of a dielectric body for transmitting an electromagnetic wave, and having a gas ejection hole for ejecting a gas into the processing container; forming a discharge prevention member having a discharge prevention member body comprised of a dielectric body having a permeability, and a dense member comprised of a dielectric body without a permeability covering at least a side face of the discharge prevention member body; and attaching the discharge prevention member in the gas ejection hole of the top plate body.

6 Claims, 12 Drawing Sheets

(56) References Cited

U.S. PATENT DOCUMENTS

| | | | |
|---|---|---|---|
| 8,372,200 B2* | 2/2013 | Okesaku et al. | 118/715 |
| 2001/0052322 A1 | 12/2001 | Hirayama et al. | |
| 2003/0037880 A1* | 2/2003 | Carducci et al. | 156/345.43 |
| 2003/0178144 A1* | 9/2003 | Ohmi et al. | 156/345.41 |
| 2004/0168769 A1* | 9/2004 | Matsuoka et al. | 156/345.33 |
| 2004/0221809 A1* | 11/2004 | Ohmi et al. | 118/715 |
| 2004/0261712 A1* | 12/2004 | Hayashi et al. | 118/723 E |
| 2005/0092437 A1* | 5/2005 | Ohmi et al. | 156/345.41 |
| 2005/0109460 A1* | 5/2005 | DeDontney et al. | 156/345.33 |
| 2006/0021703 A1 | 2/2006 | Umotoy et al. | |
| 2007/0068625 A1* | 3/2007 | Funk et al. | 156/345.29 |
| 2007/0181531 A1 | 8/2007 | Horiguchi et al. | |
| 2009/0229753 A1* | 9/2009 | Ohmi et al. | 156/345.34 |
| 2009/0229755 A1 | 9/2009 | Ohmi et al. | |
| 2009/0286405 A1* | 11/2009 | Okesaku et al. | 438/710 |
| 2009/0311869 A1* | 12/2009 | Okesaku et al. | 438/710 |
| 2010/0178775 A1* | 7/2010 | Okesaku et al. | 438/726 |
| 2010/0230387 A1* | 9/2010 | Okesaku et al. | 216/69 |
| 2010/0288439 A1* | 11/2010 | Ishibashi et al. | 156/345.33 |
| 2013/0112337 A1* | 5/2013 | Okesaku et al. | 156/89.11 |

FOREIGN PATENT DOCUMENTS

| | | |
|---|---|---|
| JP | 05-345982 A | 12/1993 |
| JP | 09-181052 A | 7/1997 |
| JP | 11-340208 A | 12/1999 |
| JP | 2001-015493 A | 1/2001 |
| JP | 2003-332326 A | 11/2003 |
| JP | 2003-338492 A | 11/2003 |
| JP | 2004-039972 A | 2/2004 |
| JP | 3117331 U | 1/2006 |
| WO | 2004/095531 A2 | 11/2004 |

\* cited by examiner

MANUFACTURING METHOD OF TOP PLATE OF PLASMA PROCESSING APPARATUS

CROSS-REFERENCE TO RELATED APPLICATION

This is a divisional application of U.S. patent application Ser. No. 12/157,660 filed on Jun. 11, 2008, which claims priority under 35 U.S.C. §120 and 35 U.S.C. §365(c) as a continuation of international application number PCT/JP2007/050914, filed on Jan. 22, 2007 that claims priority to Japanese patent application number 2006-012965, filed on Jan. 20, 2006.

FIELD OF THE INVENTION

The present invention relates to a manufacturing method of a top plate hermetically attached to an upper opening of a tubular shaped container body for forming a processing container of a plasma processing apparatus.

BACKGROUND OF THE INVENTION

In recent years, plasma processing apparatuses are used for treatments, such as deposition, etching, or asking, in a manufacturing process of semiconductor products. Specially, a plasma processing apparatus which generates a high-density plasma using a microwave is likely to be used because the plasma is stably generated in a high vacuum state at a relatively low pressure of about 0.1 mTorr (13.3 mPa) to a few Torr (a few hundreds Pa). Such plasma processing apparatus is disclosed in, for example, Japanese Published Unexamined Application Nos. H3-191073, H5-343334, H9-181052, 2003-332326, 2004-039972.

A common plasma processing apparatus using a microwave will be explained in summary with reference to FIG. 18.

A plasma processing apparatus 2 shown in FIG. 18 is provided with a placing table 6 for placing a semiconductor wafer W in a vacuum processing container 4. On the upper portion facing to this placing table 6, a disk-shape top plate 8, which transmits a microwave, is provided hermetically. On the side wall of the processing container 4, a gas nozzle 9 is provided for introducing a gas into the container.

On the upper face of the top plate 8, a planar antenna member 10 and a slow-wave structure 12 are provided. On the antenna member 10, a plurality of microwave ejection holes 14 are formed. A center conductor 18 of a coaxial waveguide 16 is connected to the center of the antenna member 10 to guide the microwave generated from a microwave generator 20 through a mode exchanger 22.

Then, the microwave is radiated from an ejection hole of the planar antenna member 10 while radially propagating in the radius direction of the antenna member 10. The radiated microwave is transmitted through the top plate 8 and introduced into the processing container 4. By this microwave, the plasma processing, such as etching or film forming on the semiconductor wafer W is applied using the plasma generated in a processing space S of the processing container 4.

In this case, a necessary gas is supplied from the gas nozzle 9 provided on the side wall of the processing container 4. For this reason, the disassociation degree of the gas is different in the outside of the wafer W which is located close to the nozzle 9, and the center portion of the wafer W depending on the time that the distributed processing gas is exposed to the plasma. As a result of this, there have been cases of an uneven etching rate or film thickness by the plasma processing a wafer face.

Therefore, a measure, such as that disclosed in, for example, the Japanese Published Unexamined Patent Application No. H5-345982, has been taken. That is, a gas channel is provided in the center conductor 18, which passes through the center of the coaxial waveguide 16, by forming a stick shaped center conductor that is hollow in the center. Also, the gas passage is provided so as to penetrate the top plate 8 to communicate with the gas channel of the center conductor 18. In this way, the process gas is directly introduced to the center of the processing space S.

However, in this case, the electric field strength inside the gas channel formed in the center of the top plate 8 is high, and the plasma in the processing space easily intrudes into the gas passage from the front end opening of the gas passage, thus there are cases where an abnormal electric discharge occurs in the gas passage. For this reason, there has been a problem of damaging the top plate 8 by excessive heat to the center of the top plate 8 due to this plasma abnormal electric discharge.

Therefore, forming the gas passage which extends in a radius direction to the center portion, onto the top plate 8 itself can be considered. However, this configuration can not be adopted because the electric field strength inside the gas channel is high, and the plasma in the processing space easily intrudes into the gas passage from the front end opening of the gas passage in this case as well, thereby the plasma abnormal electric discharge occurs.

Also, a configuration in which a shower head is prepared by assembling glass tubes having a plurality of gas ejection holes in a lattice shape and providing the shower head to the upper portion of the processing container, has been proposed. However, it is not preferable because the plasma abnormal electric discharge occurs in this case as well.

SUMMARY OF THE INVENTION

The present invention has been made focusing on the issues described above to effectively resolve these. The objective of the present invention is to prevent a plasma abnormal electric discharge in a plasma processing apparatus in which an electromagnetic wave for generating a plasma and a gas are introduced through a top plate of a processing container or a shower head.

In order to achieve this objective, the present invention provides a plasma processing apparatus that includes;

a vacuum processing container having a tubular container body with a formed upper opening, and a dielectric top plate, which transmits an electromagnetic wave, with the top plate hermetically attached on this upper opening of the container body;

a placing table provided in the processing container for placing an objective to be processed;

an electromagnetic wave supplying system for supplying an electromagnetic wave for generating a plasma into the processing container through the top plate; and a gas supplying system for supplying a gas containing a process gas into the processing container;

wherein a gas ejection hole is formed on the top plate for ejecting on the gas supplied from the gas supplying system into the processing container, and a discharge prevention member consisting of a dielectric body having a permeability is arranged in each ejection hole.

In this way, by providing the discharge prevention member consisting of a dielectric body having a permeability in each ejection hole provided to the top plate of the processing container, the plasma abnormal electric discharge can be prevented while maintaining the introduction of the gas into the processing container through the gas ejection hole.

It is preferable that the plurality of gas ejection holes is provided to the top plate with spacing from each other and the discharge prevention member is arranged in each of the ejection holes.

In a case when a gas channel is provided to the top plate for guiding the gas supplied from the gas supplying system to the gas ejection holes, it is preferable to also provide the discharge prevention member to this gas channel. This prevents an abnormal plasma electric discharge in the gas channel while maintaining the circulation of the gas in the gas channel.

The main material comprising the discharge prevention member is preferably the same material as that of the top plate, especially from the standpoint of the coefficient of thermal expansion.

The discharge prevention member may be formed with a porous material. In such a case, the porous diameter of the porous material is preferably 0.1 mm or below. The diameter of the gas ejection is preferably not more than ½ of the wave length of the electromagnetic wave propagating in the top plate. For example, the electromagnetic wave supplying system has a planar antenna member provided on the top plate, a microwave generator for generating a microwave, and a waveguide for transmitting the microwave generated from the microwave generator to the planar antenna member. Alternatively, the electromagnetic wave supplying system has a high-frequency wave generator for generating a high-frequency wave, and an induction coil arranged on the top plate and connected to the high-frequency wave generator.

The discharge prevention member preferably has a discharge prevention member body consisting of a dielectric body having a permeability, and a dense member consisting of a dielectric body without a permeability covering at least the side face of the discharge prevention member body. For example, the dense member is formed in a tubular form in advance. Alternatively, the dense member consists of an adhesive layer formed by curing an adhesive coated on the surface of the discharge prevention member body. It is preferable that a gas channel is formed on the top plate for guiding the gas supplied from the gas supplying system to the gas ejection hole, and a gas head space having a cross sectional area larger than the cross section area of the gas channel is provided between the gas channel and the gas ejection hole. And, the discharge prevention member body preferably has a gas ejection face corresponding to the opening of the gas ejection hole, a gas introducing face on the opposite side of the gas ejection face, and a gas introducing depression formed on the gas introducing face.

Further, the present invention provides a plasma processing apparatus that includes;
a vacuum processing container,
a placing table provided in a processing container for placing an object to be processed;
a shower head having a gas ejection face which includes a plurality of gas ejection openings for ejecting a gas containing a processing gas into the processing container, provided to the upper portion of the treatment container; and
a high-frequency wave supplying system for supplying a high-frequency wave applied between two electrodes, with the placing table being a lower electrode and the shower head being an upper electrode;
wherein a dielectric discharge member consisting of a dielectric body having a permeability is attached to the gas ejection face of the shower head.

In this apparatus, the discharge prevention member may also be formed with a porous material, however, the porous diameter of the porous material is preferably 0.1 mm or below.

Another aspect of the present invention is to provide a top plate hermetically attached to an upper opening of a tubular shaped container body for forming a processing container of a plasma processing apparatus; and the top plate includes a top plate body consisting of a dielectric body transmitting an electromagnetic wave and a gas ejection hole formed on the top plate body for ejecting a gas into the processing container, and a discharge prevention member consisting of a dielectric body having a permeability arranged in the gas ejection hole of the top plate body.

A gas channel for guiding the gas into the gas ejection hole may be formed on the top plate body.

Further, another aspect of the present invention is to provide a manufacturing method for a top plate hermetically attached to an upper opening of a tubular shaped container body for forming a processing container of a plasma processing apparatus, and the method includes the steps of;
preparing a top plate body consisting of a dielectric body transmitting an electromagnetic wave having a gas ejection hole for ejecting a gas into a processing container;
forming a discharge prevention member including a dielectric body having a permeability, and a dense member consisting of a dielectric body without a permeability covering at least a side face of this discharge prevention member body; and
attaching the discharge prevention member in the gas ejection hole of the top plate body.

For example, the process for forming the discharge prevention member further includes the sub-steps of;
preparing the dense member formed in a tubular shape in advance; and
baking the tubular-shaped dense member filled with the material of the discharge prevention member body.

Alternatively, the process for forming the discharge prevention member includes the sub-steps of;
forming an adhesive layer by curing an adhesive, that is the fused material of the dense member, coated on the entire surface of the discharge prevention member body;
removing the adhesive layer from the gas ejection face of the discharge prevention member corresponding to the opening of the gas ejection hole; and
forming a gas introducing depression on the gas introducing face on the opposite side of the ejection face of the discharge prevention member body.

For example, in the process for attaching the discharge prevention member, an adhesive is applied between the discharge prevention member and the gas ejection hole.

Alternatively, in the process for attaching the discharge prevention member, the discharge prevention member and the top plate are baked as a unit while the discharge prevention member is inserted into the gas ejection hole.

DETAILED DESCRIPTION OF THE INVENTION

One embodiment of a plasma processing apparatus pertaining to the present invention will be hereinafter explained with reference to the figures.

(First Embodiment)

Figure 1:
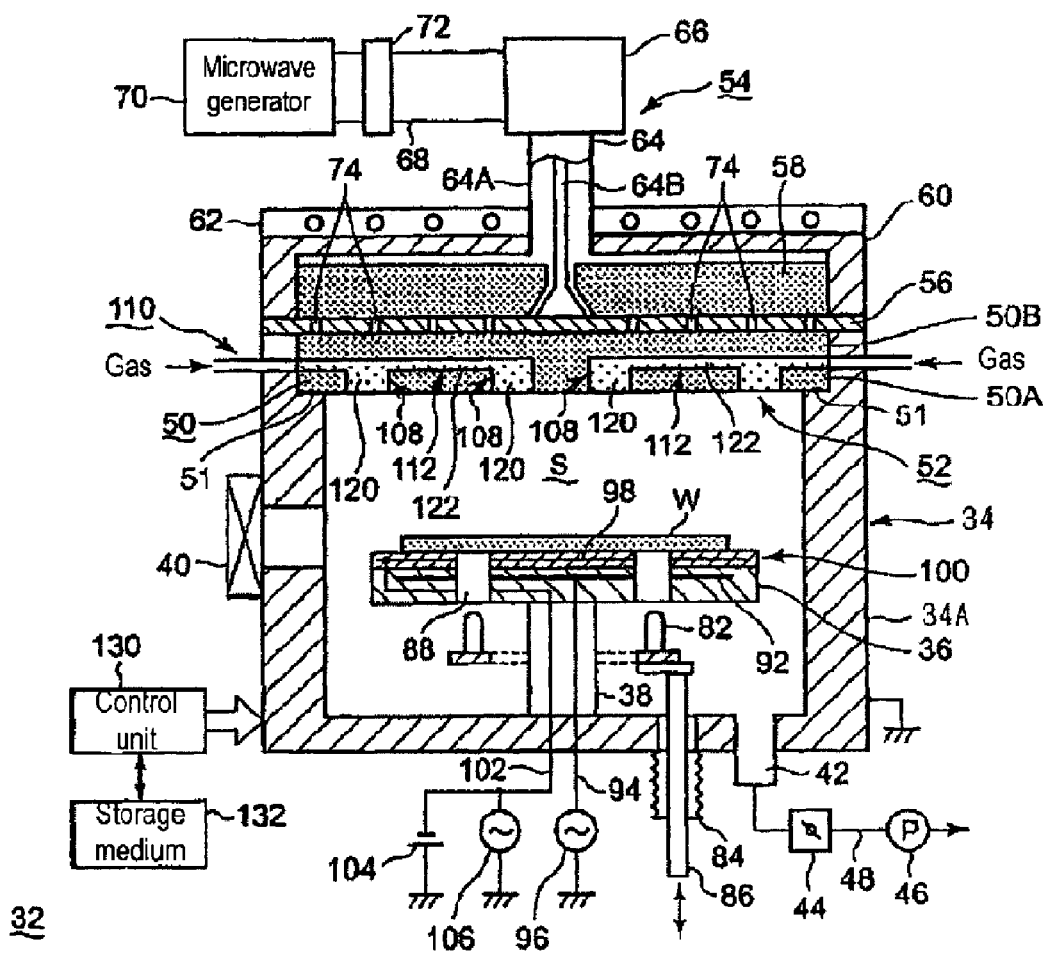
FIG. 1 is a longitudinal sectional view of a first embodiment of a plasma processing apparatus pertaining to the present invention.

A plasma processing apparatus 32 shown in FIG. 1 is the apparatus for performing an etching process using a plasma. The apparatus 32 is provided with a vacuum processing container 34, which forms a processing space S hermetically closed inside. This processing container 34 has a tubular container body 34A, in which an upper opening is formed, and a disk-shaped top plate 50, which is attached to the upper opening of this container body 34A. The top plate 50 is attached hermetically against the upper opening of the container body 34A through a sealing member 51, such as an O-ring. The container body 34A is formed from a conductor, such as aluminum, and is grounded.

Inside of this processing container 34, provided is a placing table 36 on an upper face for placing a semiconductor wafer W as a processing object. This placing table 36 is, for example, formed in a disk-shape from a ceramic, such as alumina, and supported by a column 38 on the bottom portion of the container. On the side wall of the container body 34A, provided is a gate valve 40 that opens and closes to the processing space S when moving the wafer in and out. Also, on the bottom portion of the container body 34A, an exhaust opening 42 is provided. Onto this exhaust opening 42, an exhaust channel 48, which is connected to a pressure control valve 44 and a vacuum pump in series, is connected for vacuuming the processing container 34 to a predetermined pressure as needed.

On the lower side of the placing table 36, provided is a plurality of elevation pins 82, for example, three elevation pins 82 for moving the wafer up and down when carrying the wafer in and out (FIG. 1 only shows two pins). The elevation pin 82 is moved up and down by an elevation rod 86, which is provided through an extensible bellows 84 that penetrates the bottom portion of the container body 34A. Onto the placing table 36, pin inserting holes 88 are formed for inserting the elevation pins 82. The entire placing table 36 consists of a heat resistant material, for example, a ceramic, such as alumina. Onto the placing table 36, for example, a thin plate-shaped resistance heater 92 is implanted and provided as a heating means. This heater 92 is connected to a heater power source 96 through a wiring 94 passing through the column 38.

On the upper face side of the placing table 36, provided is an electrostatic chuck 100 having a conductor line 98. This electrostatic chuck 100 enables the electrostatic absorption of the wafer W. The conductor line 98 of the electrostatic chuck 100 is connected to a direct current (DC) power source 104 through a wiring 102. This wiring 102 is connected to a high-frequency power source 106 for applying a high-frequency power of, for example, 13.56 MHz for bias.

The body of the top plate 50 is formed from a dielectric body transmitting a microwave, for example, a ceramic, such as a quartz or Al2O3. The thickness of this top plate 50 is configured to be, for example, approximately 20 mm considering the resistance to pressure. Onto the body of the top plate 50, a plurality of gas ejection holes 108 and gas channels 112 are formed as described later.

This apparatus 32 is provided with an electromagnetic wave supplying system 54 that introduces the microwave, that is an electromagnetic wave for plasma generation, into the processing container 34 through the top plate 50. This electromagnetic wave supplying system 54 has a disk-shaped planar antenna member 56 provided to the upper face of the top plate 50, and a microwave generator 70 for generating a microwave of, for example, 2.45 GHz or 8.35 GHz. A slow-wave structure 58 is provided on the antenna member 56. This slow-wave structure 58 consists of a material with high permittivity characteristics, such as an aluminum nitride, for abbreviating the wave length of the microwave. The planar antenna member 56 is configured to be a bottom plate of a waveguide box 60 consisting of a conductive cylindrical container covering the slow-wave structure 58. On the upper portion of the waveguide box 60, a cooling jacket 62 is provided for cooling the waveguide box 60.

The wave guide box 60 is conductive with the processing container 34 at an outer circumference portion of the planar antenna member 56. Onto the center of the upper portion of the waveguide box 60, an outer tube 64A of a coaxial waveguide 64 is connected. An internal conductor 64B of the coaxial waveguide 64 is connected to the center of the planar antenna member 56 through a center through hole of the slow-wave structure 58. The coaxial waveguide 64 is connected to a rectangular waveguide 68 through a mode exchanger 66. This waveguide 68 is connected to a microwave generator 70 through a matching circuit 72 for matching impedance.

The planar antenna member 56 consists of a conductive material, for example, a copper plate or an aluminum plate with a silver plating on the surface. The dimension of the antenna member 56 is, for example, 400 to 500 mm in diameter, and 1 to a few mm in thickness in a case when accommodating to a 300 mm size wafer. Onto the antenna member 56, a plurality of microwave radiation holes 74 are located, for example, in a slot shape. The arrangement of these microwave radiation holes 74 is not limited specifically, and the holes may be arranged concentrically, spirally, or radially, or distributed equally on the whole area of the antenna member. This planar antenna member 56 is a so-called RLSA (Radial Line Slot Antenna) system antenna structure, and this provides high density plasma and low electron energy characteristics.

This apparatus 32 is provided with a gas supplying system 110 for supplying a gas containing a processing gas into the processing container 34 while controlling the flow rate. As described above, a plurality of gas ejection holes 108 and the gas channels 112 are formed on the top plate 50. The gas ejection holes 108 open to the lower face of the top plate 50 for ejecting the gas towards the processing space S on the lower side. The gas channels 112 communicate with the upper end portion of each of the ejection holes 108 and extend in a horizontal direction inside the top plate 50 to guide the gas supplied from the gas supplying system 110 to each gas ejection hole 108. In each of the gas ejection holes 108 and the gas channels 112, filled are discharge prevention members 120 and 122 made of a dielectric body having a permeability.

Figure 2:
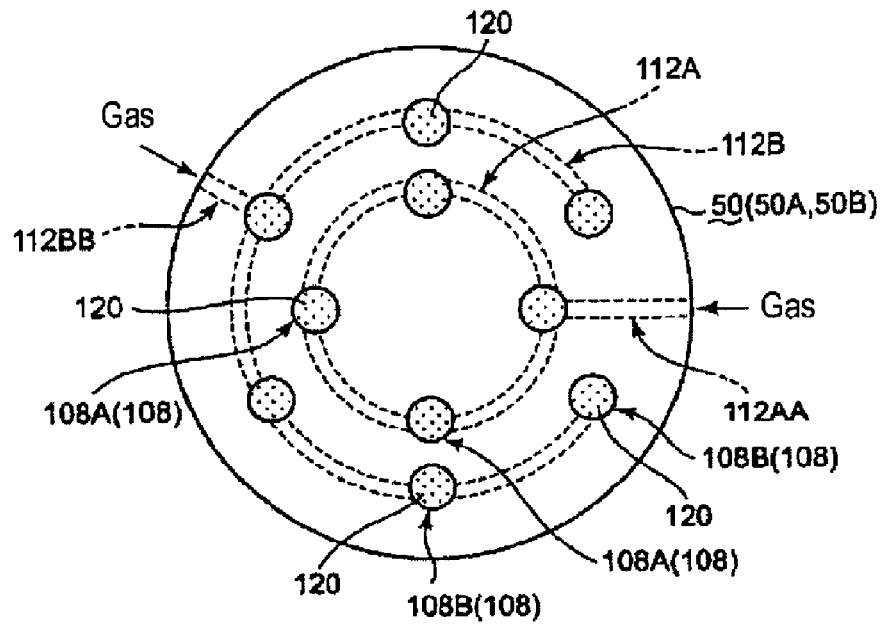
FIG. 2 is a basal plane view of a top plate in the apparatus shown in FIG. 1.

As shown in FIG. 2, the gas ejection holes 108 are in distributed formation with spacing between each other on the lower face of the top plate 50. The ejection holes 108 are divided into gas ejection holes 108A located on the inner circumference of the concentric circle, and gas ejection holes 108B located on the outer circumference. In addition, the ejection holes 108 may be arranged on one circumference, or on three or more concentric circle circumferences.

The gas channels 112 are divided into an inner gas channel 112A and an outer gas channel 112B. The inner gas channel 112A communicates with each of the inner ejection holes 108A. This inner gas channel 112A includes a gas channel 112AA extending in a radius direction to the outer circumference of the top plate 50. Also, the outer gas channel 112B communicates with each of the outer gas ejection holes 108B. This outer gas channel 112B also includes a gas channel 112BB extending in a radius direction to the outer circumference of the top plate 50.

Figure 3:
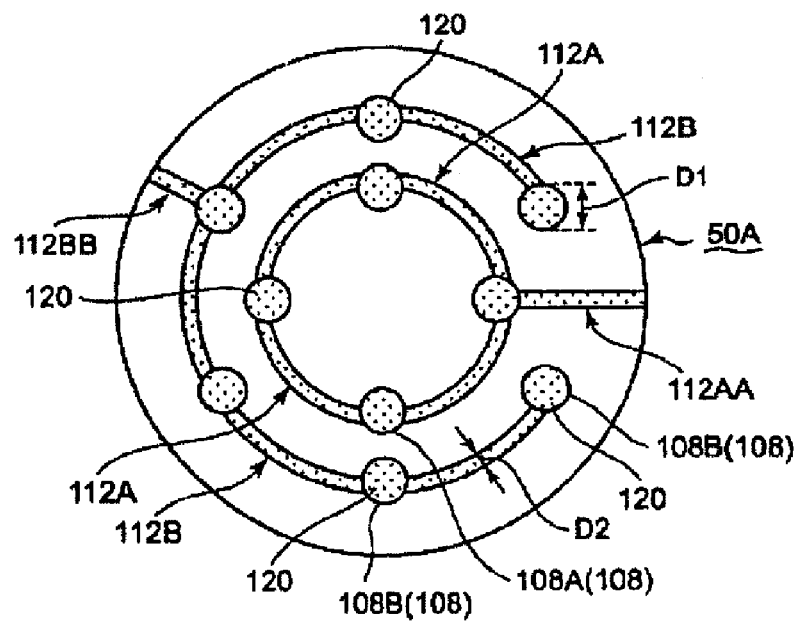
FIG. 3 is a plane view of a lower side top plate member consisting of the top plate shown in FIG. 2.

A diameter D1 of the gas ejection hole 108 shown in FIG. 3 is not more than ½ of the wave length λo of the electromagnetic wave (microwave) propagating in the top plate 50, for example, approximately 1 to 35 mm. When the diameter D1 is larger than ½ of the wave length λo, the relative permittivity at the ejection hole 108 portion significantly changes from the other portion. As a result, it is not preferable because a significant bias occurs in the plasma density to the ejection hole portion unlike the other portions.

The dimension (width) D2 for each of the gas channels 112A and 112B is preferably as small as possible in a range that does not disturb the gas flow, and at least smaller than the diameter D1 of the gas ejection hole 108. This prevents any adverse effect to the distribution of the microwave and the electric field.

The dielectric body material having a permeability for forming the discharge prevention members 120 and 122 is preferably a porous material with a pore diameter of 0.1 mm or below. In a case when the pore diameter is larger than 0.1 mm, the possibility for a plasma abnormal electrical discharge by the microwave increases. In the porous material forming the discharge prevention members 120 and 122, numerous pores communicate with each other, thereby permeability is provided.

Back to FIG. 1, the operation of the overall plasma processing apparatus configured as described above is controlled by a control unit 130 consisting of, for example, a computer. A program for this computer is stored in a storage medium 132 such as a floppy disk, CD (compact disk), or a flash memory. Specifically, by a command from this control unit 130, control of the gas supply or flow rate, supply of the microwave or the high-frequency or electricity control, or controls for process temperature, or process pressure are performed.

Figure 4A:
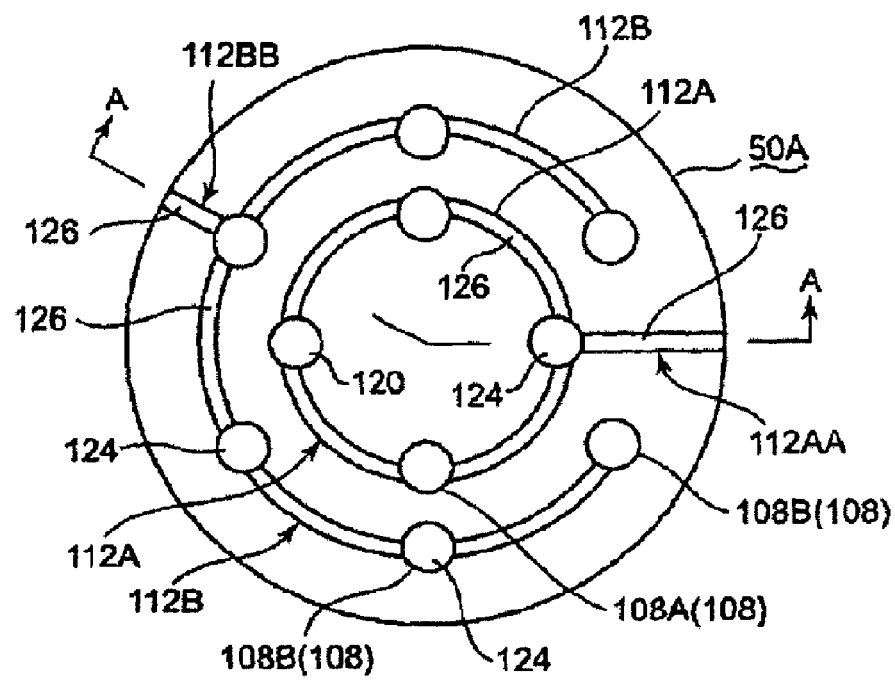
FIG. 4A shows a condition before installing a discharge prevention member on the lower top plate member shown in FIG. 3.
Figure 4B:
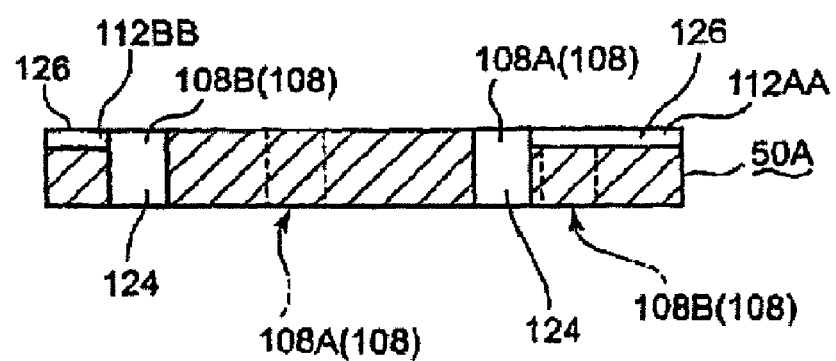
FIG. 4B is a A-A cross sectional view of the FIG. 4A.

Here, an example of a manufacturing method of the top plate 50 is briefly explained. At this time, the top plate 50 is formed by joining a lower top plate member 50A and an upper top plate member 50B. First, as shown in FIGS. 4A and 4B, a disk-shape glass substrate is provided, which consists of a base material of the lower top plate member 50A. Holes 124 corresponding to each of the gas ejection holes 108 and grooves 126 corresponding to each of the gas channels 112 are formed on this glass substrate.

Figure 5:
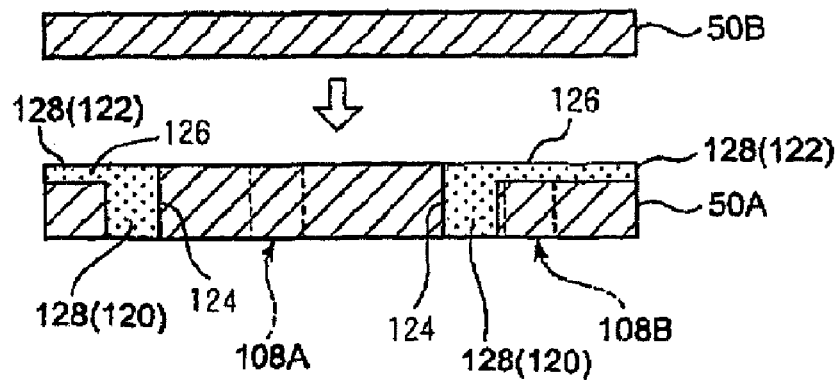
FIG. 5 shows a manufacturing process of the top plate based on the lower side top plate member shown in FIG. 4B.

Next, as shown in FIG. 5, pour the molten porous quartz containing bubbles, which consists the material of the discharge prevention member 128 (120, 122), in each of the through holes 124 and the groove 126, and the porous quartz is then solidified. Thereafter, the entire surface of the substrate is polished to planarize, thereby the lower top plate member 50A is completed. Next, the upper top plate member 50B, which consists of a disk-shaped glass substrate planarized separately, is installed on the lower top plate member 50A. Then, both top plate members 50A and 50B are joined to each other by baking and heat treating at a temperature not more than the strain point of the quartz. In this way, the top plate 50, which is filled with the discharge prevention members 120 and 122 made of the porous quartz, is completed.

Next, a plasma process, in which the processing apparatus 32 configured as described above is used, for example in an etching process, is hereinafter explained.

First, the semiconductor wafer W is carried into the processing container 34 through the gate valve 40, placed on the placing table 36, and absorbed with the electrostatic chuck 100. This wafer W is maintained at a predetermined process temperature by the resistance heater 92. The gas supplying system 110 supplies gases, such as Cl2 gas, O2 gas and N2 gas, into the processing container 34 at a predetermined flow rate, respectively. These gases are ejected into the processing container 34 from each of the gas ejection holes 108A and 108B through the gas channels 112A and 112B of the top plate 50. Meanwhile, the processing container 34 is maintained to a predetermined process pressure by controlling the pressure control valve 44.

At the same time, the electromagnetic wave supplying system 54 supplies the microwave generated from the microwave generator 70 to the planar antenna member 56 and the microwave, which shortens the wave length by the slow-wave structure 58, and is introduced into the processing container 34. This generates the plasma in the processing space S to perform the etching process.

Specifically, the etching layer on the surface of the wafer W is etched and removed by the active species generated from plasmanizing each of the Cl2, O2, and N2 gas. Also, at the etching process, the high-frequency for bias is applied from the high-frequency power source 106 for providing bias to the conductor line 98 in the electrostatic chuck 100. This prevents the etching form from deforming as much as possible by attracting the active species to the wafer surface with a favorable rectilinear propagation property.

In this apparatus 32, the gas supplied through the gas channels 112A and 112B is diffused in a shower state and supplied to the lower side from the gas ejection holes 108A and 108B that are decentrally arranged about the lower face of the top plate 50. In this way, the gas is supplied equally to the entire processing space S.

And, since each of the gas ejection holes 108 and the gas channel 112 is filled with the discharge prevention members 120 and 122 having a permeability, the circulation of the gas can be secured without generating an abnormal electrical discharge from the microwave. Further, because the gas is diffused and ejected to every direction by the discharge prevention member 120 made of the porous material provided to the gas ejection hole 108, the gas can be diffused more evenly to the entire processing space S. Especially, the porous diameter of the porous material for each of the discharge prevention members 120 and 122 is configured to be 0.1 mm or below, thus abnormal electric discharge can be prevented.

Further, the diameter D1 of the gas ejection hole 108 is configured to be not more than ½ of the wave length λo of the microwave propagating in the dielectric body of the top plate 50, thereby the change in the relative permittivity at the portion of the ejection hole 108 can be reduced. Therefore, the change in the electric field distribution at the portion of the gas ejection hole 108 can be suppressed, thereby the high uniformity in the plasma density can be maintained although the ejection hole 108 is provided. As an example, the electric filed strength is simulated by configuring the top plate 50 with a quartz glass with a relative permittivity of 3.78 and burying a porous quartz with a relative permittivity of 2.7 in the gas ejection hole 108 with a diameter D1 of 32 mm (the wave length in the top plate: about 64 mm). As a result, it is confirmed that the electric field strength right under the gas ejection hole 108 only decreased by about half, which is still sufficient.

In addition, the gas ejection hole 108 is divided into two groups, that is, the inner and outer gas ejection holes 108A and 108B, thus the gas flow rate can be independently controlled by each group. In such a case, the processing space S can be supplied with the gas in a more even distribution, or in a desired distribution state. Further, three or more groups of the gas ejection holes may be provided as needed. Still further, different types of gas may be supplied to each group of the gas ejection holes 108.

The main material that comprises the discharge prevention members 120 and 122 is preferably the same material as the main body of the top plate 50 from the stand point of the coefficient of thermal expansion. For example, in a case when the quartz glass is used for the top plate 50 main body, it is preferable to use the porous quartz for the discharge prevention members 120 and 120. Also, in a case when the ceramic material is used for the top plate 50 main body, it is preferable to use the porous ceramic for the discharge prevention members 120 and 122. Here, alumina, silica, calcium phosphate, SiC, zirconia, and so on may be used as a ceramic material. Further, the porous ceramics disclosed in, for example, Japanese Published Unexamined Patent Application Nos. 2002-343788, 2003-95764, and 2004-59344, may also be used.

Figure 6:
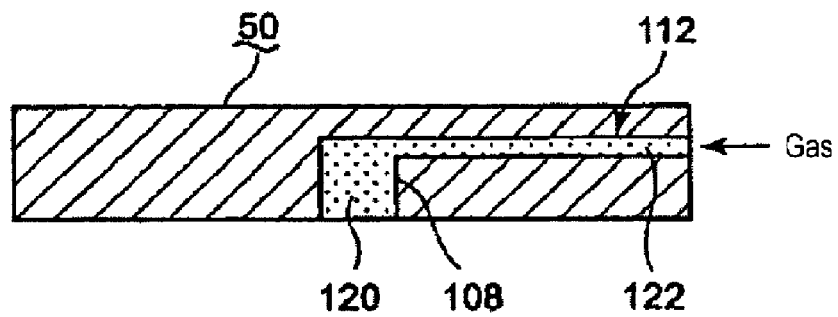
FIG. 6 is a longitudinal sectional view of a modification example of the top plate.

The number of the gas ejection holes 108 is not limited to the examples shown in the figures. For example, a single gas ejection hole 108 may be provided to the center of the top plate 50 as shown in the modification example in FIG. 6. Also, as shown in another modification example in FIG. 7, in stead of providing the gas channel to the top plate 50, a metal gas pipe 136 may be arranged on the upper side of the top plate 50 to supply the gas to the gas ejection hole 108. In this case, the gas ejection hole 108 is provided so as to penetrate the top plate 50 in the vertical direction. And a flange section 138 of the gas tube 136 is connected hermetically on the upper end section of the ejection hole 108 through a sealing member 140, such as an O-ring and so on. It is preferable that the gas pipe 136 is configured as thin as possible to avoid an adverse effect to the propagation of the microwave in the planar antenna member 56, and is formed with a metal material with a favorable conductive property, such as a copper.

(Second Embodiment)

The electromagnetic wave for generating a plasma is not limited to the microwave, and for example, a high-frequency wave with a lower frequency compared to the microwave may be used.

Figure 8:
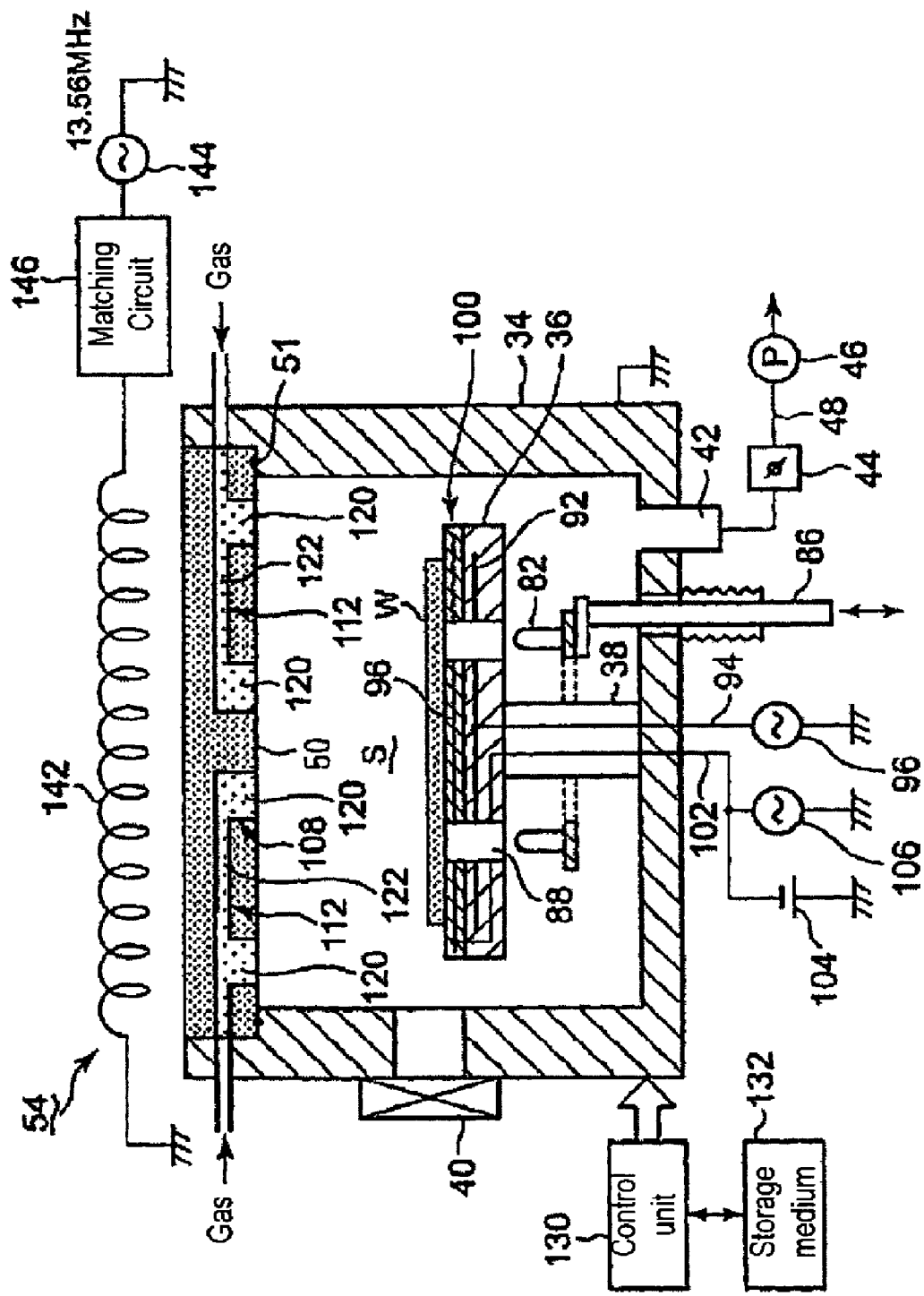
FIG. 8 is a longitudinal sectional view of a second embodiment of a plasma processing apparatus pertaining to the present invention.

In the second embodiment of the present invention shown in FIG. 8, the high-frequency wave is used as an electromagnetic wave, and an induction coil 142 is used in the electromagnetic wave supplying system. In FIG. 8, the same reference numbers are provided to the portions with same configuration as those shown in FIG. 1 and the explanation is omitted.

As shown in FIG. 8, the gas ejection hole 108 and the gas channel 112 of the top plate 50, and the dielectric discharge protection members 120 and 122 filled-in thereof are configured the same as the first embodiment shown in FIG. 1. Meanwhile, the electromagnetic supplying system 54 in this embodiment has the induction coil 142 provided in proximity on the top plate 50 and a high-frequency wave generator 144 connected to the induction coil 142 for generating the high-frequency wave. As a frequency of the high frequency wave, for example, 13.56 MHz may be used. Between the high-frequency wave generator 144 and the induction coil 142, a matching circuit 146 is provided for impedance matching.

In this embodiment, when a high frequency wave is supplied to the induction coil 142, the electric field is generated in the processing space S through the top plate 50. Also in this embodiment, the gas can be dispersed evenly in the processing space S without generating the abnormal electric discharge in the gas ejection hole 108 or the gas channel 112, similar to the embodiment 1.

(Third Embodiment)

Figure 9:
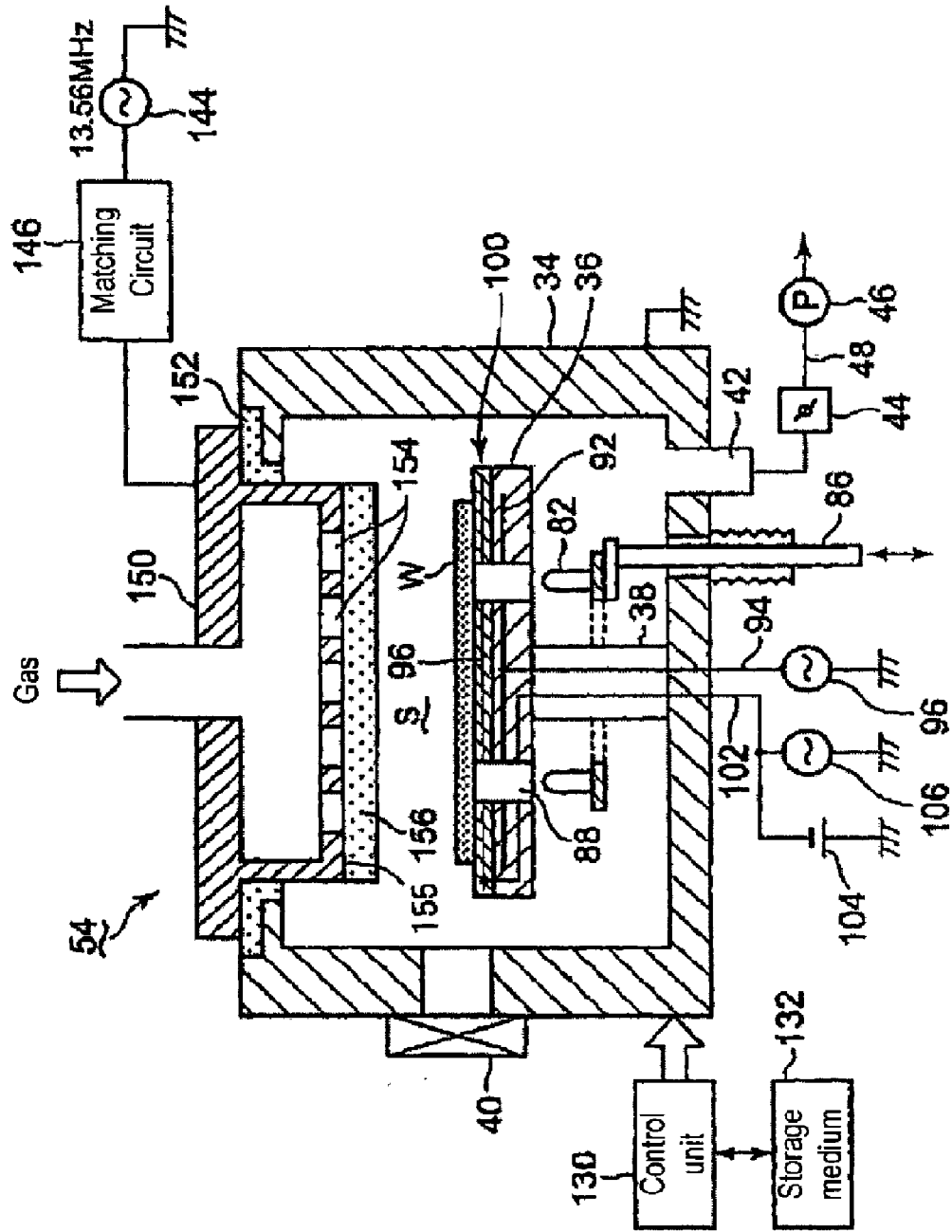
FIG. 9 is a longitudinal sectional view of a third embodiment of a plasma processing apparatus pertaining to the present invention.

In the third embodiment of the present invention shown in FIG. 9, a high-frequency wave is used as an electromagnetic wave, as well as a parallel plate type electrode is used as a part of the electromagnetic wave supplying system 54. In FIG. 9, the same reference numbers are used to the configuration same as those in FIGS. 1 and 8, and the explanation is omitted.

In the third embodiment of the present invention shown in FIG. 9, a cylindrical shape shower head 150 made of a metal is provided, the shower head 150 is attached to the upper portion of the processing container 34 though an insulating material 152. This shower head 150 has a gas ejection face (lower face) 155 with a plurality of gas ejection openings 154 formed to eject the gas into the processing container 34. The electromagnetic supplying system 54 of this embodiment is configured as a high frequency wave supplying system for supplying a high frequency wave applied between both electrodes 36 and 150, with the placing table 36 being a lower electrode and the shower head 150 being an upper electrode. Specifically, the shower head 150 is provided to the upper section of the processing container 34, in stead of the top plate, and the high-frequency wave generator 144 is connected to this shower head 150 through the matching circuit 146.

On the gas ejection face 155 of the shower head 150, the disk-shape discharge prevention member 156 is made from a dielectric body having a permeability, and is attached so as to cover the gas ejection opening 154. By this discharge prevention member 156, the gas ejected from each of the gas ejection openings 154 can be dispersed evenly in the processing space S without generating an abnormal electric discharge in each of the gas ejection openings 154.

(Fourth Embodiment)

Next, the fourth embodiment of the plasma processing apparatus of the present invention is explained. Except for the top plate of this embodiment, the configurations are the same as those of the first and the second embodiments, thus the explanation is omitted.

In the first or the second embodiment, there are some problems because the discharge prevention member 120 is directly attached in the gas ejection hole 108 of the top plate 50 main body. That is, the discharge prevention member 120 consists of a material having a permeability, such as a porous material, and the surface is not smooth, thus the dimension accuracy tends to be low. For this reason, a slight gap tends to be created between the outer circumference face of the discharge prevention member 120 and a dense material (such as a quartz or a ceramic material) which comprise the inner circumference face of the gas ejection hole 108. There is a concern of an abnormal electric discharge caused by the plasma in the processing space penetrating into the gas channel.

Therefore, with respect to the discharge prevention member in this fourth embodiment, the handling is simplified, as well as the dimension accuracy is increased, and further the attachment is made to prevent a plasma leak.

Figure 10:
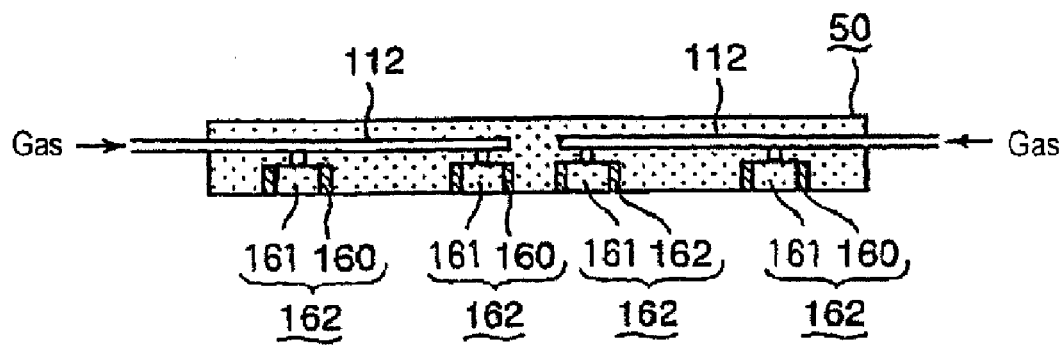
FIG. 10 is a longitudinal sectional view of a top plate of a fourth embodiment of a plasma processing apparatus pertaining to the present invention.
Figure 12:
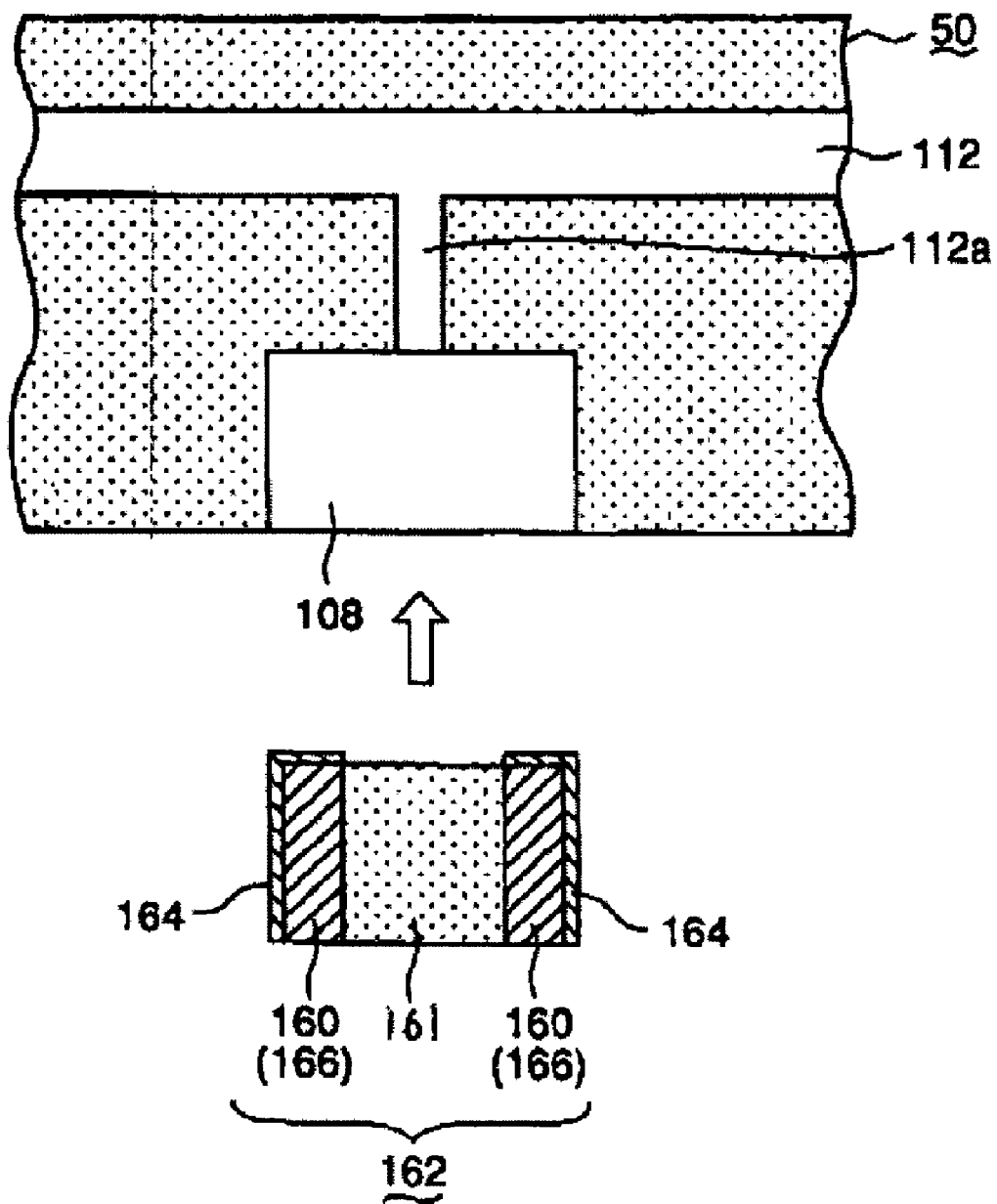
FIG. 12 is an assembly drawing of the top plate shown in FIG. 11.

Specifically, as shown in FIGS. 10 and 12, the discharge prevention member 162 of this embodiment consists of a discharge prevention member body 161 corresponding to the discharge prevention member 120 described above, and a dense member 160 made of a dielectric body without a permeability that at least covers a side face of the body 161. More specifically, the side face of the cylindrical shape discharge prevention member body 161 is covered by the dense member 160 to form the discharge prevention member 162.

Further, on the top plate 50 of this embodiment, formed are a main gas channel 112 extending in the horizontal direction and a bifurcated gas channel 112a which is bifurcated from the main gas channel 112 and extends downward. The front end of the bifurcated gas channel 112a communicates with the center portion of the gas ejection hole 108.

The top plate 50 of this embodiment is manufactured as follows (FIG. 12). First, the top plate 50 body, in which the plurality of gas ejection holes are formed, and the discharge prevention member bodies 161 in the number corresponding to the number of the gas ejection holes 108 are prepared. Next, the side face of each of the discharge prevention member bodies 161 is covered with the dense member 160 and each of the discharge prevention members 162 is formed. Then, these discharge prevention members 162 are attached on each of the gas ejection holes of the top plate 50 body.

At this time, an adhesive is applied between the discharge prevention members 162 and the gas ejection holes. In this case, the adhesive 164 only needs to be applied to at least one of the inner wall faces of the gas ejection holes 108 or the surface of the discharge prevention members 162 (dense member 160). FIG. 12 shows a condition where the adhesive 164 is applied only on the surface of the dense member 160.

The process for forming the discharge prevention member 162 may consist of a sub-process for preparing the dense member 160 which is formed in a tubular shape in advance, and a sub-process for baking the tubular shaped dense member 160 filled with the material of the discharge prevention member body 161. A dense member 160, for example, a tubular shape (here, in a cylindrical shape) pipe material 166 consists of a dense material of ceramic material, such as a quartz, or Al2O3, may be used.

Also, the adhesive 164 described above, for example, a quartz-alumina series adhesive may be used. The attachment of the discharge prevention member body 162 to the top plate 50 body is performed at a high temperature so that adhesive 164 is fused, for example at about 500 degree/C. to 1000 degree/C.

The height and the diameter of the discharge prevention member 162 are about 10 mm each, and the thickness of the pipe material 166 is about 2 to 4 mm, however, the values are not limited to these. Also, the inner diameter of the bifurcating gas channel 122a is preferably as thin as possible not to affect the electromagnetic distribution, typically not more than 1/10 of the wave length $\lambda o$ described above, and preferably about 1 to 2 mm.

In case of this fourth embodiment, the circulation of the gas may be secured by the discharge prevention member 162 without causing an abnormal plasma electric discharge in the gas ejection hole 108.

Also, the dense member 160 (especially the pipe material 166) forming the outer circumference face of the discharge prevention member 162 increases the accuracy of the outer diameter dimension compared to the discharge prevention member body 161. For this reason, the discharge prevention member 162 can be attached by accurately joining with the gas ejection hole 108 without a gap. Especially, because the quartz and the ceramic material, which are the material of the top plate 50 body formed with the gas ejection hole 108, and the quartz and the ceramic material which form the dense member 160, are the same dense material, they can be attached accurately without any slight gap at the boundary portion. For this reason, an abnormal electric discharge caused by the plasma in the processing space S infusing into the gas ejection hole 108 or the gas channels 112a and 112 can be prevented.

Further, the defects of the discharge prevention member 162 can be removed before attaching them by individually performing a characteristics inspection before attaching into the gas ejection hole 108. Therefore, the defect rate after completing the top plate 50 may be significantly decreased.

In addition, in a case when attaching the discharge prevention member body 161 by itself in the gas ejection hole 108 without using the dense member 160, the defective fraction was about 20% due to unevenly distributed adhesive 164 or a gap occurring between the joining boundary portion. On the other hand, in the case of this embodiment, the defective fraction can be suppressed to about 10%.

(Fifth Embodiment)

Next, the fifth embodiment of the plasma processing apparatus of the present invention is explained. Except for the configuration of the top plate of this embodiment, the configurations are the same as those of the first and the second embodiments, thus the explanation is omitted. Also, as for the configuration of the top plate, explanation for the portions are the same as those of the fourth embodiments, and thus the explanation is omitted.

Figure 13:
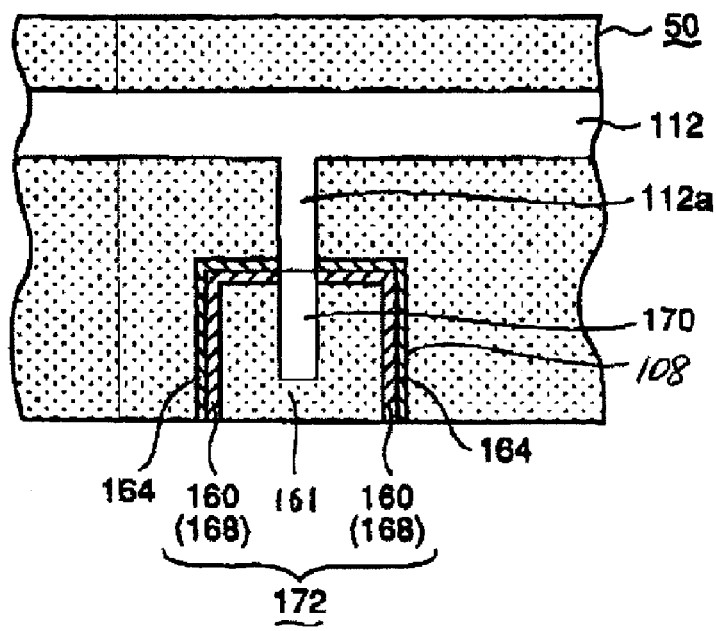
FIG. 13 is a longitudinal sectional view showing an enlarged main section of a top plate of a fifth embodiment of a plasma processing apparatus pertaining to the present invention.

In the discharge prevention member 172 of this embodiment shown in FIG. 13, an adhesive layer 168 is used as the dense member 160 which covers the side face of the discharge prevention member body 161, instead of the dense member shape in tubular form in advance, such as the pipe material 166 in the fourth embodiment described above. Further, the discharge prevention member 172 in this embodiment has a gas introducing depression 170 formed on a gas introducing face 176 (FIG. 14D)) on the opposite side of the gas ejection face 174 corresponding to the opening of the gas ejection hole 108 of the discharge prevention member body 161. This discharge prevention member 172 is also attached in the gas ejection hole 108 using the adhesive as with the discharge prevention member 162 described above. As the material of the adhesive layer 168 consists of the dense member 160, for example, the same material as that of the adhesive 164 used to attach the discharge prevention member 162 may be used.

Figure 14:
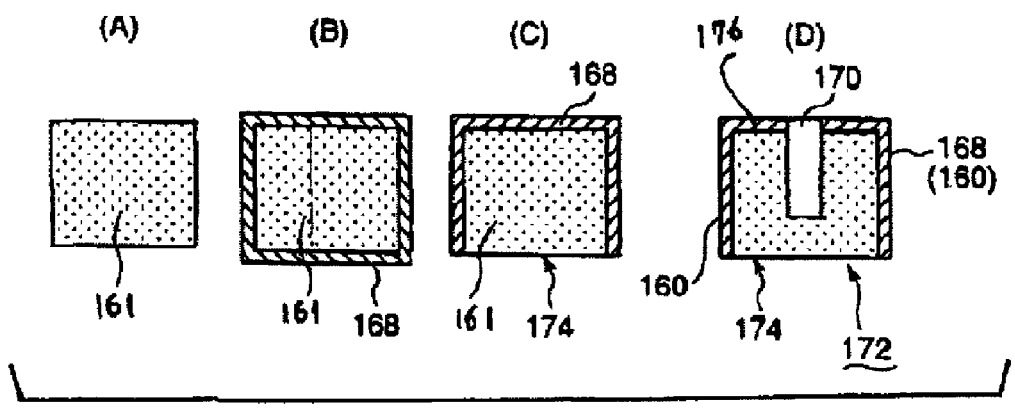
FIG. 14 shows a manufacturing process of the discharging prevention member shown in FIG. 13.

Here, the manufacturing process of the discharge prevention member shown in FIG. 14 is explained. First, as shown in FIG. 14(A), the discharge prevention member body 161, which is formed in a tubular shape using a dielectric body having a permeability (for example, a porous material), is prepared. Next, as shown in FIG. 14(B), the adhesive layer 168 is formed by coating the adhesive, which is a dense material in a fused state at a high temperature (by a dipping method and so on), on the entire surface of this discharge prevention member body 161, then cooling to cure. In this way, the entire surface of the discharge prevention member body 161 is sealed with the adhesive layer 168.

Next, as shown in FIG. 14(C), the adhesive layer 168 is removed from the gas ejection face 174 of the discharge prevention member body 161 corresponding to the opening of the gas ejection hole 108 to expose the ejection face 174 for chamfering. Then, as shown in FIG. 14(D), the gas introduction depression 170 is formed on the gas introduction face 176 on the opposite side of the ejection face 174 (penetrating through the adhesive layer 168). In addition, the adhesive layer 168 may be removed from the gas ejection face 174 after forming the gas introduction depression 170.

In the case of the fifth embodiment, the same effect can be exerted as the fourth embodiment. Further, in the case of this fifth embodiment, the gas can be diffused in the discharge prevention member body 161 by the gas introduction projection 170 after introducing the gas deeper into the body 161. For this reason, for example, even in a case when the adhesive 164 is cured in a state that a portion of the adhesive is protruding into the bifurcating gas channel 112*a* side, the gas can evenly be supplied from the ejection face 174 of the discharge prevention member 161 without an effect of the protruded adhesive 164. Further, there is no adverse effect to the conductance of the discharge prevention member 172.

Figure 11:
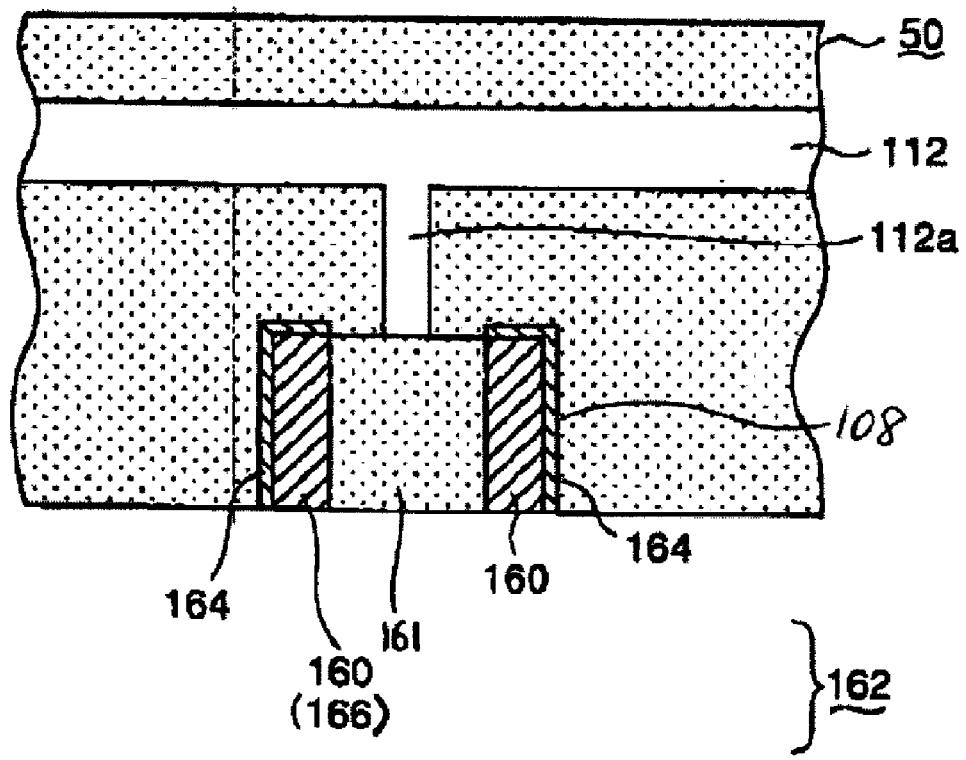
FIG. 11 is an enlarged view of a main section of the top plate shown in FIG. 10.

Any defects in the discharge prevention member 172 can also be removed in advance before attaching by performing the individual characteristics inspection before attaching in the gas ejection hole 108. Therefore, any defects can be significantly reduced. In the case of this embodiment, the defective percentage of the top plate after attaching the discharge prevention member 172 can be suppressed to 1 to 2%. In addition, the gas introduction depression 170 may be applied to the fourth embodiment shown in FIG. 11.

(Modification Examples of Fourth and Fifth Embodiments)

Figure 15A:
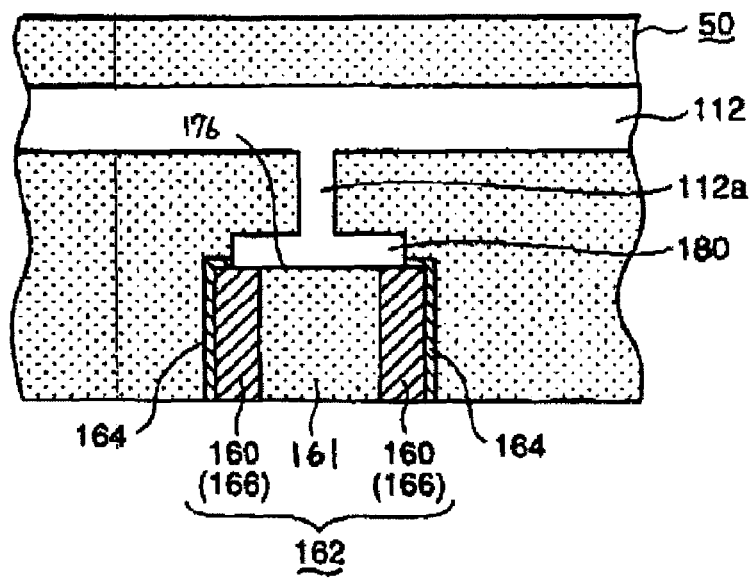
FIG. 15A shows a modification example of the top plate of the fourth embodiment shown in FIG. 11.

Next, modification examples of the fourth and fifth embodiments are explained. FIG. 15A shows a modification example of the fourth embodiment and FIG. 15B shows a modification example of the fifth embodiment.

Figure 15B:
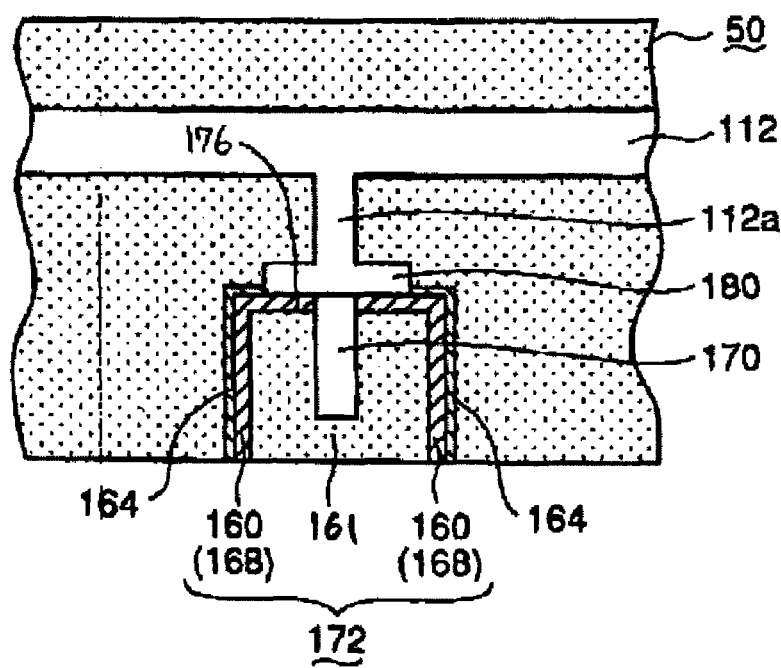
FIG. 15B shows a modification example of the top plate of the fifth embodiment shown in FIG. 13.

In the modification examples shown in FIGS. 15A and 15B, a gas head space 180, which has a cross-sectional area larger than the cross-sectional area of the bifurcating gas channel 112*a*, is formed between the bifurcating gas channel 112*a* and the gas ejection hole 108. By this gas head space 180, the gas can further be distributed evenly in the dielectric discharge prevention member body 161.

Specially, in the case shown in FIG. 15A, it is preferable to form the gas head space 180 in a cylindrical shape that is larger than the diameter of the discharge prevention member body 161 and smaller than the outer diameter of the dense member 160, in order to suppress the adverse effect due to excessive protruding of the adhesive 164. In a case when the gas head space 180 is provided to the gas introduction side of the discharge prevention members 162 and 172 in this way, even when the excessive adhesive 164 protrudes, this does not cover the gas introducing face 176 of the discharge prevention member 161. Therefore, the adverse effect to the conductance after attaching the discharge prevention members 162 and 172 can be prevented.

Figure 7:
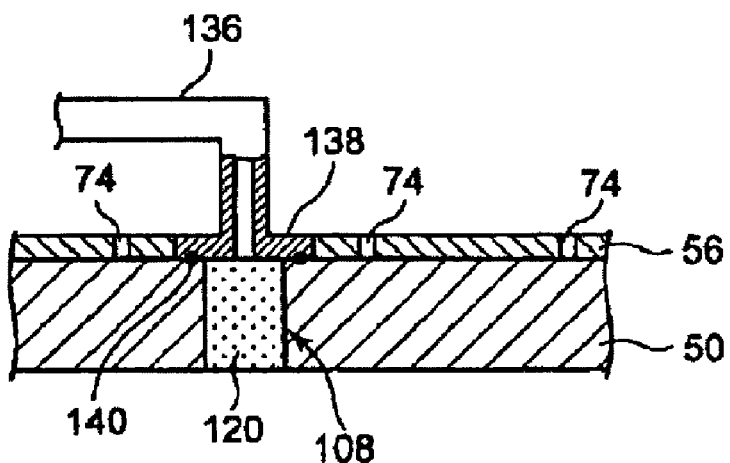
FIG. 7 is a longitudinal sectional view of another modification example of the top plate.
Figure 16:
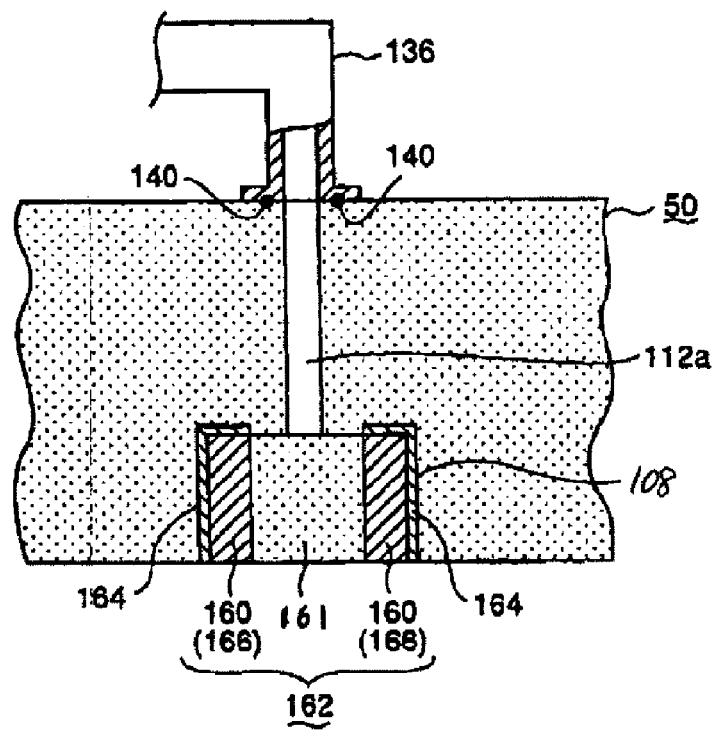
FIG. 16 shows another modification example of the top plate of the fourth embodiment shown in FIG. 11.

Further, the configuration shown in FIG. 7 may be configured to another modification example of the fourth embodiment shown in FIG. 16 by applying the fourth embodiment.

That is, the modification example shown in FIG. 16 introduces the gas from the gas pipe 136 made of a metal arranged on an upper side of the top plate 50 to the gas ejection hole 108, which has the discharge prevention member 162 attached, through the gas channel 112*a*, which vertically penetrates the top plate 50.

Such configuration provided with the gas pipe 136 may be applied to the modification example of the fourth embodiment shown in FIG. 15A, the fifth embodiment, and the modification example of the fifth embodiment shown in FIG. 15B.

In the embodiments shown in FIGS. 10 and 16 described above, the example of applying the adhesive 164 in the process of attaching the discharge prevention members 162 and 172 in the gas ejection hole is explained, however, it is not limited to this example. For example, without using the adhesive 164, the members 162 and 172, and the top plate 50 body may be baked as a unit (deposited onto each other) by maintaining them in a high-temperature state, such as about 700 to 900 degree/C., while in a state that the discharge prevention members 162 and 172 are inserted into the gas ejection hole 108.

In each of the embodiment described above, the example of processing the disk-shaped semiconductor wafer W as a processing object is explained, however, it may be a rectangular shape processing object such as a LCD (Liquid Crystal Display) substrate.

Figure 17:
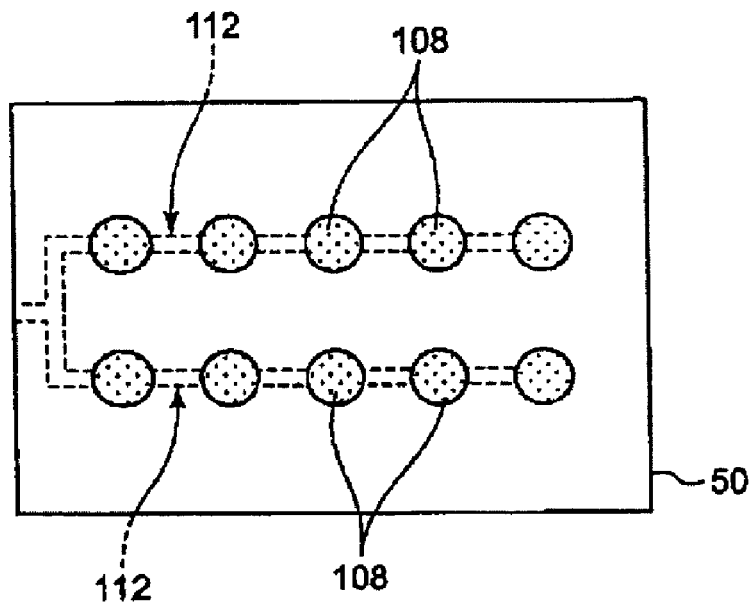
FIG. 17 is a basal plane view of a top plate in a rectangular form.
Figure 18:
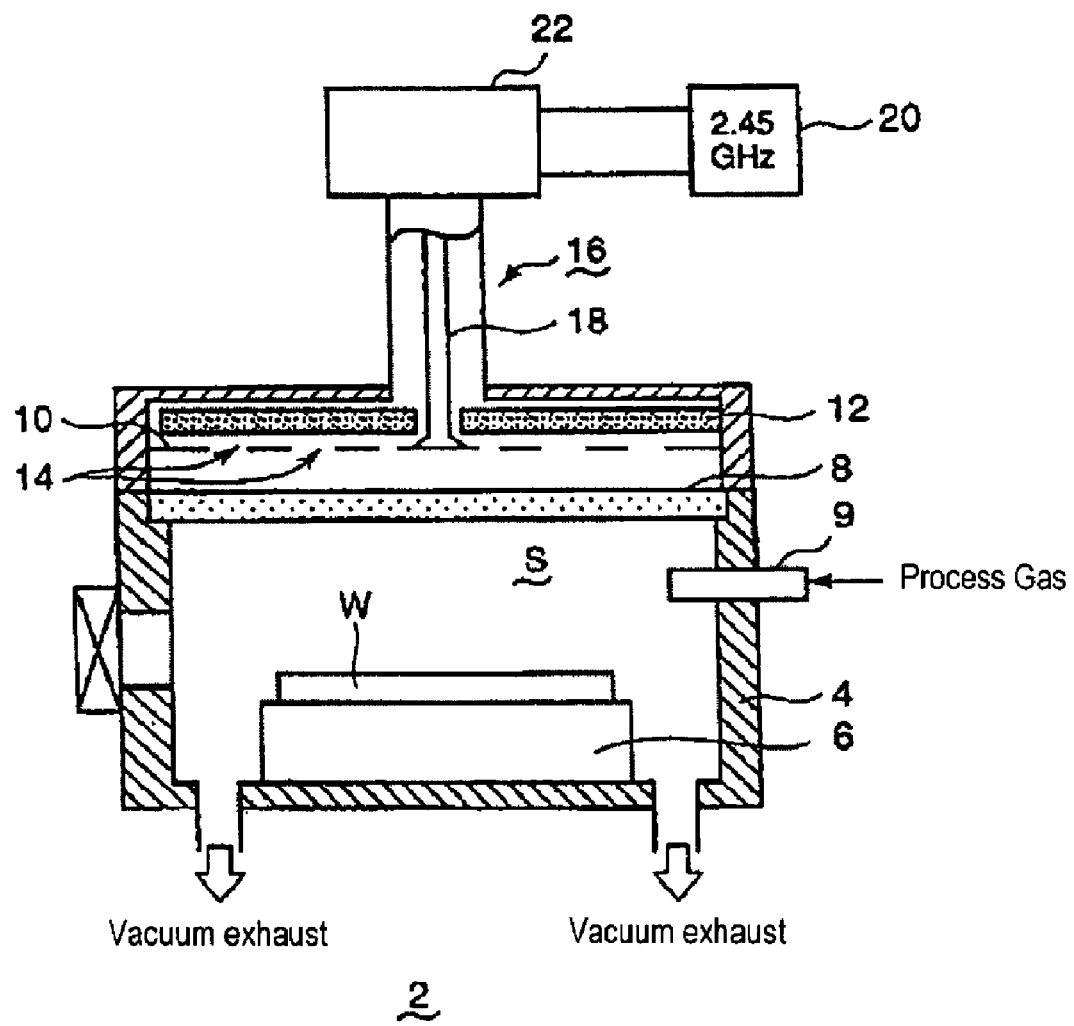
FIG. 18 is a longitudinal sectional view of a conventional common microwave plasma processing apparatus.

FIG. 17 shows a modification example of the top plate for the plasma processing apparatus to process a rectangular shaped processing object. In such a processing apparatus, a horizontal cross section of the processing container is formed in a rectangular shape and to support this, the planar shape of the top plate 50 is also in a rectangular shape as shown in FIG. 17. And the gas ejection holes 108 are arranged with spacing from each other on a plurality of parallel straight lines (two in the figure) extending in the longitudinal direction of the top plate 50.

Each of the dimensions explained in each of the embodiments merely shows an example, and it is apparent that the dimensions are not limited to these examples. Further, the processing object is not limited to the semiconductor wafer or the LCD substrate, and it may be other glass substrates or ceramic substrates.

What is claimed is:

1. A manufacturing method of a top plate hermetically attached to an upper opening of a tubular shaped container body for forming a processing container of a plasma processing apparatus, the method comprising the steps of;

preparing a top plate body comprised of a dielectric body for transmitting an electromagnetic wave, and having a gas ejection hole for ejecting a gas into the processing container;

forming a discharge prevention member having a discharge prevention member body comprised of a dielectric body having a permeability, and a dense member comprised of a dielectric body without a permeability covering at least a side face of the discharge prevention member body; and attaching the discharge prevention member in the gas ejection hole of the top plate body,
wherein the process for forming the discharge prevention member further comprises the steps of;
preparing the dense member formed in a tubular shape; and
baking the tubular shaped dense member filled with a material comprising the discharge prevention member body.

2. A manufacturing method of a top plate hermetically attached to an upper opening of a tubular shaped container body for forming a processing container of a plasma processing apparatus, the method comprising the steps of;
preparing a top plate body comprised of a dielectric body for transmitting an electromagnetic wave, and having a gas ejection hole for ejecting a gas into the processing container;
forming a discharge prevention member having a discharge prevention member body comprised of a dielectric body having a permeability, and a dense member comprised of a dielectric body without a permeability covering at least a side face of the discharge prevention member body; and
attaching the discharge prevention member in the gas ejection hole of the top plate body, wherein the process for forming the discharge prevention member further comprises the steps of;
forming an adhesive layer by curing the adhesive, the adhesive layer comprising a material of the dense member in a dissolved state, coated on an entire surface of the discharge prevention member body;
removing the adhesive layer from a gas ejection face of the discharge prevention member corresponding to an opening of the gas ejection hole; and
forming a gas introducing depression on a gas introducing face on an opposite side of the gas ejection face of the discharge prevention member body.

3. The manufacturing method of the top plate according to claim 1, wherein an adhesive is applied between the discharge prevention member and the gas ejection hole.

4. The manufacturing method of the top plate according to claim 1, wherein the discharge prevention member and the top plate are baked as a unit.

5. The manufacturing method of the top plate according to claim 2, wherein an adhesive is applied between the discharge prevention member and the gas ejection hole.

6. The manufacturing method of the top plate according to claim 2, wherein the discharge prevention member and the top plate are baked as a unit.

* * * * *

UNITED STATES PATENT AND TRADEMARK OFFICE
CERTIFICATE OF CORRECTION

PATENT NO. : 8,925,351 B2
APPLICATION NO. : 13/938507
DATED : January 6, 2015
INVENTOR(S) : Caizhong Tian Page 1 of 1

It is certified that error appears in the above-identified patent and that said Letters Patent is hereby corrected as shown below:

In the Specification

Column 6, line 3, please add -- 46 -- between "pump" and "in"

Signed and Sealed this
Twenty-third Day of June, 2015

Michelle K. Lee
*Director of the United States Patent and Trademark Office*